United States Patent [19]
Abe et al.

[11] Patent Number: 5,459,573
[45] Date of Patent: Oct. 17, 1995

[54] LIGHT QUANTITY CONTROLLING APPARATUS

[75] Inventors: Naoto Abe, Isehara; Koji Uda, Yokohama; Isamu Shimoda, Zama; Shunichi Uzawa, Tokyo; Noriyuki Nose, Machida, all of Japan

[73] Assignee: Canon Kabushiki Kaisha, Tokyo, Japan

[21] Appl. No.: 291,747

[22] Filed: Aug. 17, 1994

Related U.S. Application Data

[63] Continuation of Ser. No. 145,657, Nov. 4, 1993, abandoned, which is a continuation of Ser. No. 895,462, Jun. 8, 1992, abandoned, which is a continuation of Ser. No. 401,119, Aug. 31, 1989, abandoned.

[30] Foreign Application Priority Data

Sep. 2, 1988 [JP] Japan ................................. 63-218523

[51] Int. Cl.⁶ .......................... G01B 11/00; G01N 21/86
[52] U.S. Cl. ............................................. 356/401; 250/548
[58] Field of Search ........................ 356/399–401, 356/153, 154, 354, 356, 432, 375; 250/548, 557, 205, 225, 561; 355/33; 372/31, 38, 29

[56] References Cited

U.S. PATENT DOCUMENTS

| | | | |
|---|---|---|---|
| 4,124,301 | 11/1978 | Pocock | 356/432 |
| 4,166,985 | 9/1979 | White et al. . | |
| 4,311,389 | 1/1982 | Fay et al. | 356/400 |
| 4,589,773 | 5/1986 | Ido et al. | 356/376 |
| 4,600,309 | 7/1986 | Fay | 356/401 |
| 4,611,122 | 9/1986 | Nakano et al. . | |
| 4,634,876 | 1/1987 | Ayata | 356/400 |
| 4,654,723 | 3/1987 | Nagano | 250/205 |
| 4,659,228 | 4/1987 | Totsuka et al. . | |
| 4,662,753 | 5/1987 | Yabu | 356/401 |
| 4,685,775 | 8/1987 | Goodman et al. . | |
| 4,811,348 | 3/1989 | Arimoto et al. . | |
| 4,815,854 | 3/1989 | Tanaka et al. | 356/401 |
| 4,853,745 | 8/1989 | Kamiya et al. | 356/401 |
| 4,864,123 | 9/1989 | Mizutani et al. | 250/225 |
| 4,934,810 | 6/1990 | Nagele et al. | 356/376 |
| 5,008,797 | 7/1991 | Abe et al. | 250/557 |

FOREIGN PATENT DOCUMENTS

| | | |
|---|---|---|
| 333326 | 9/1989 | European Pat. Off. . |
| 3804452 | 8/1988 | Germany . |
| 2025090 | 1/1980 | United Kingdom . |
| 2187591 | 9/1987 | United Kingdom . |
| 2195031 | 3/1988 | United Kingdom . |

OTHER PUBLICATIONS

Elektronik Notizen, "Laser–Belichtung verkurzt Leiterplatten–Produktion", Verlag, et al., Oct. 21, 1983.

*Primary Examiner*—Hoa Q. Pham
*Attorney, Agent, or Firm*—Fitzpatrick, Cella, Harper & Scinto

[57] ABSTRACT

A position detecting apparatus usable for aligning mask and a semiconductor wafer, wherein a laser beam produced by a semiconductor laser is projected through a predetermined optical system to alignment marks formed on the mask and the wafer, and the light reflected by the marks are detected by an accumulation type sensor to produce an electrical signal, from which the relative positional relation between the mask and the wafer are detected on the basis of the electrical signal. To obtain proper mark signals, the quantity of light incident on the accumulation sensor is controlled. In this apparatus, the beam emitting strength of the semiconductor laser is made constant, and the control of thee amount of light incident on the accumulation sensor is effected by controlling the operation period of the semiconductor laser. In addition, the actuation timing of the semiconductor laser is advanced from the accumulation start of the accumulation type sensor by the time required for the semiconductor laser to be thermally stabilized after its actuation. The mark detection signal produced by the accumulation sensor is precise.

25 Claims, 5 Drawing Sheets

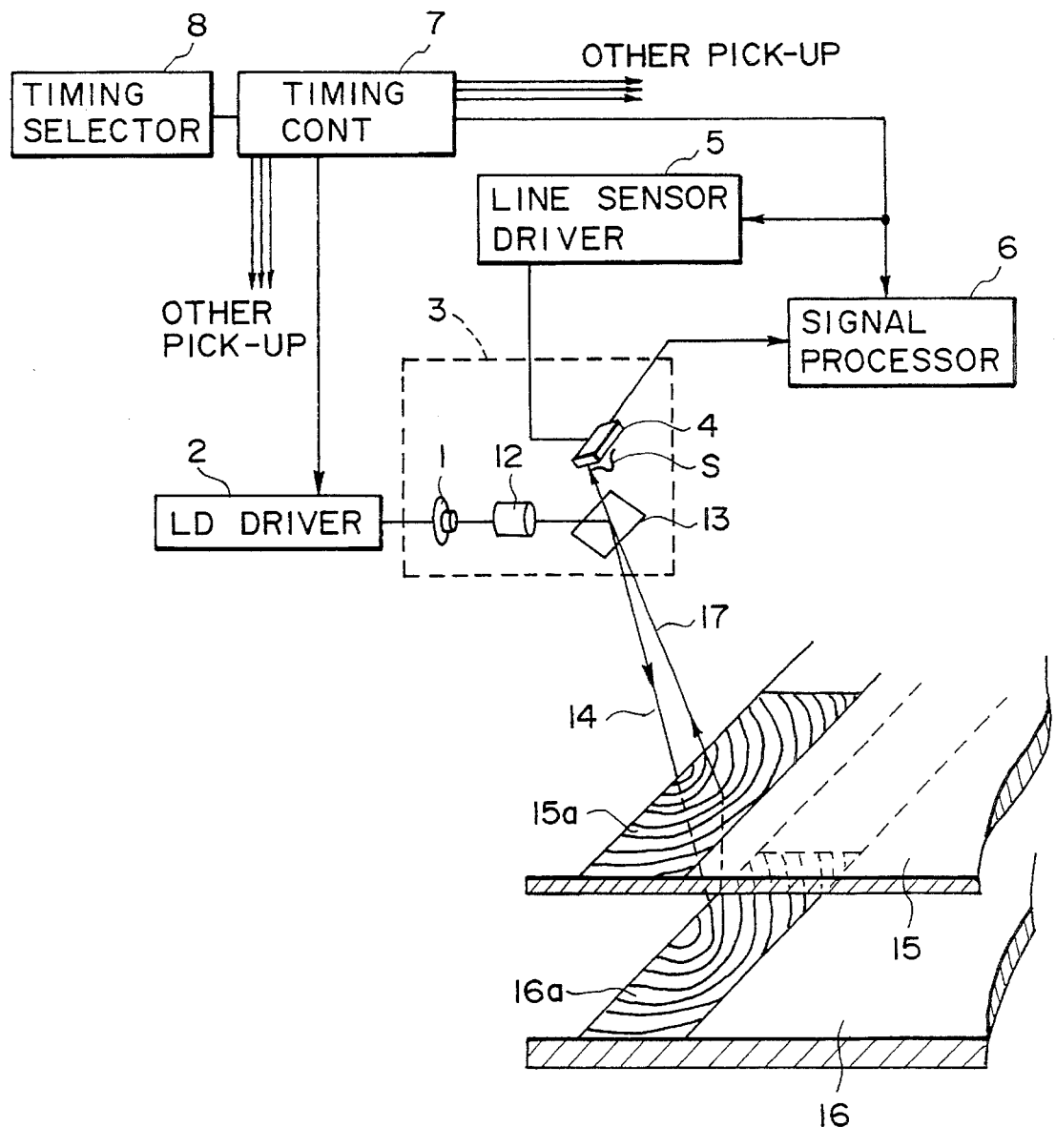
F I G. 1

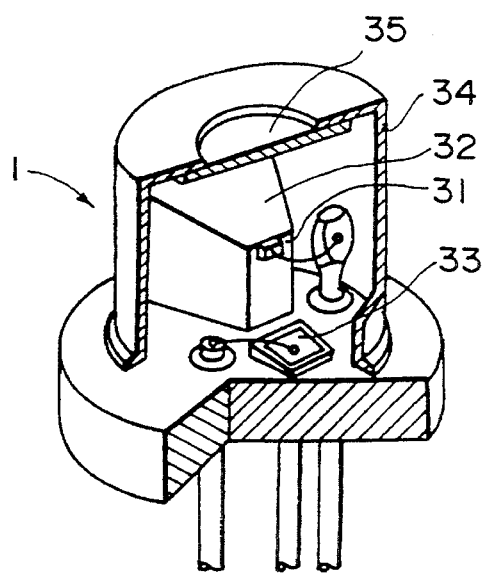
F I G. 4
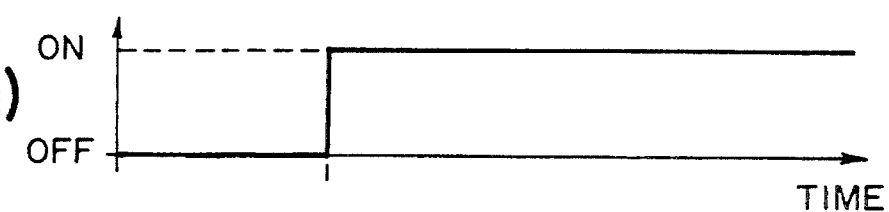
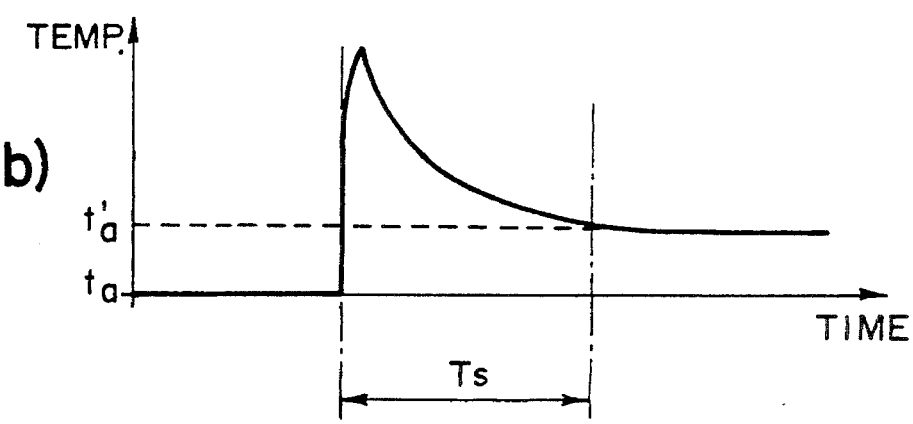
F I G. 5(b)

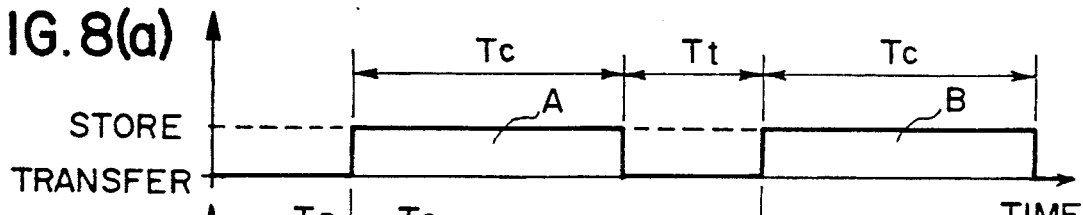
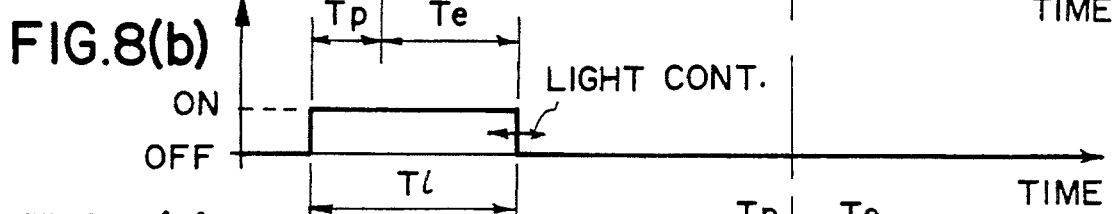
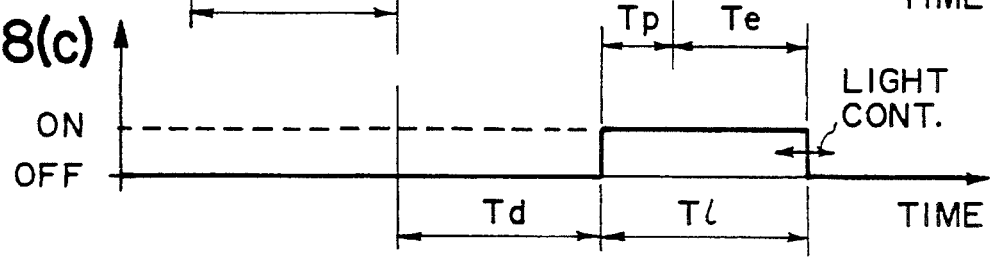
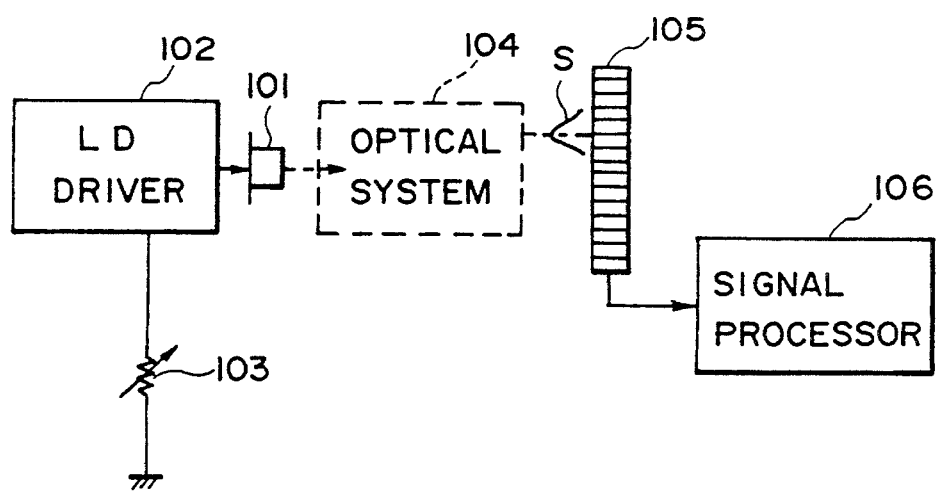
FIG. 9
PRIOR ART

LIGHT QUANTITY CONTROLLING APPARATUS

This application is a continuation of application Ser. No. 08/145,657, filed Nov. 4, 1993, now abandoned, which is a continuation of application Ser. No. 07/895,462, filed Jun. 8, 1992, now abandoned, which is a continuation of application Ser. No. 07/401,119, filed Aug. 31, 1989, now abandoned.

FIELD OF THE INVENTION AND RELATED ART

The present invention relates to a light quantity controlling apparatus, more particularly to the light quantity controlling apparatus for controlling the quantity of light incident on a photoelectric transducer element through an optical system from a light emitting element in a high precision optical measurement apparatus such as a position detector wherein the relative positional relation between a mask and a wafer is photoelectrically detected using alignment marks formed on the mask and the wafer.

In a conventional system, the quantity or strength of the light in a high precision optical measurement apparatus has been carried out by controlling the emitting output of a light emitting element such as a semiconductor laser source, and more particularly by continuously changing the strength of the emitted light to control the light amount incident on the photoelectric transducer element.

Referring first to FIG. 9, there is shown a block diagram illustrating an example of a conventional optical apparatus. The apparatus in this figure comprises a semiconductor laser 101 functioning as the light emitting element, an LD driver 102 for driving the semiconductor laser 101, a light output controller 103 for controlling the emitted output of the semiconductor laser 101, an optical system 104 for precise optical measurement, an accumulation type sensor 105 such as CCD element for receiving the light having passed through the optical system 104, and a signal processor for receiving the electrical signal to which the line sensor 105 converts the information of light received thereby. A reference character S designates a strength distribution of the light rays incident on the line sensor 105.

The semiconductor laser 101 is driven by the LD driver 102 through a light output controller 103 so as to provide a predetermined output. The beam emitted from the semiconductor laser 101 carries light information (position information) by passing through the optical system 104. The information is photoelectrically converted by the line sensor 105. The output of the line sensor 105 is processed by the signal processor 106, by which various electrical information such as position information, for example, is determined.

In such an optical measurement apparatus, when the quantity of light incident on the line sensor 105 is small, the level of the electrical signal provided by the line sensor 105 is low, so that the so-called S/N ratio is low, with the result that the accuracy of the result of the signal processing by the signal processor 104 is degrated. On the other hand, when the quantity of light incident on the line sensor 105 is large, the electrical signal provided by the line sensor 105 is saturated, with the same result, that is, the accuracy of the result of the processing is degrated. Therefore, in the conventional measurement system, when the proper quantity of light can not be provided due to the change or changes in the transmissivity, the reflection index, the refraction index, the diffraction index or the like, the light emitting output of the light emitting element (light source), that is, the strength of the produced light is continuously changed, so as to provide proper quantity of light incident on photoelectric transducer element.

SUMMARY OF THE INVENTION

Since in a conventional system, the current through the semiconductor laser 101 is changed to continuously change the light emitting output, it has been found that there is a problem that the oscillation mode, the oscillation wavelength, the coherence length, the position of the light emitting point and the shape of a emitted light are changed due to the heat that is produced by the system. This results in the change in the transmissivity, the reflection index, the refraction index and the diffraction index which is a significant problem in a high precision optical measurement apparatus.

Accordingly, it is a principal object of the present invention by which the quantity of light can be controlled without a change in the oscillation mode, the oscillation wavelength, the coherence length, the position of emitting point or the shape of emitted light of the semiconductor laser (light source). Therefore, the influences on to the transmissivity, the reflection index, the refraction index or the diffraction index of the optical system are eliminated to achieve the production of such a the high precision optical measurement.

According to an aspect of the present invention, the quantity of light incident on the photoelectric transducer element is directed by controlling the on-duration of the semiconductor laser, and in addition, the on-timing of the semiconductor laser is advanced from time of start of detection by the photoelectric transducer element by the time required for the thermal stabilization of the semiconductor laser from the actuation thereof.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view of a position detecting apparatus according to an embodiment of the present invention.

FIG. 4 is a perspective view, partly broken away, of a semiconductor laser.

FIGS. 5(a) and 5(b) are a graph indicating a temperature change of a semiconductor laser chip upon the supply of power thereto.

FIGS. 8(a), 8(b) and 8(c) are a time chart illustrating the operational timing of the apparatus in accordance with a further embodiment of the present invention.

FIG. 9 is a schematic diagram illustrating a conventional light quantity controlling apparatus.

DETAILED DESCRIPTION OF THE PREFERRED EMBODIMENTS

Figure 2:
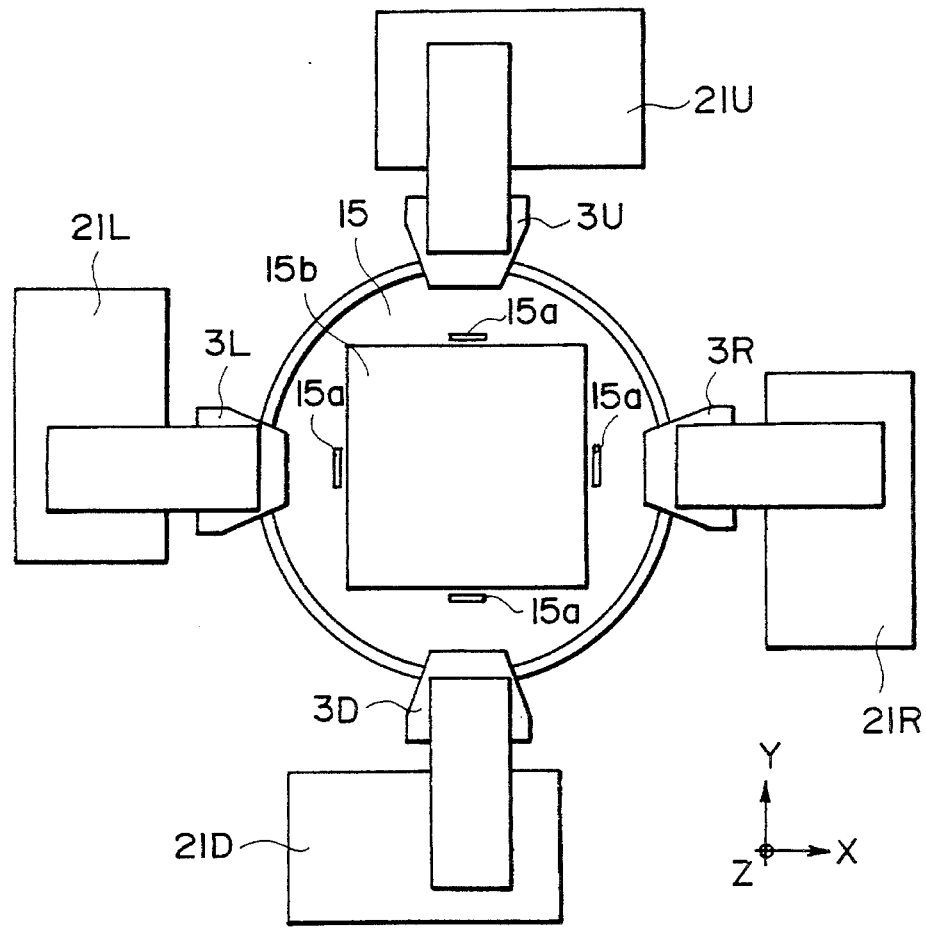
FIG. 2 is a front view showing the general arrangement of the position detecting apparatus of FIG. 1.

Referring to FIG. 1, there is shown a block diagram of a position detecting apparatus using the light quantity controlling apparatus according to an embodiment of the present invention. In this example, the position detecting apparatus is used for detecting misalignment between the mask 15 and the semiconductor wafer 16. In manufacturing a semiconductor device, an alignment error between the alignment mark 15a of the mask and the alignment mark 16a of the wafer are photoelectrically detected, and the error is corrected, and thereafter, the wafer 16 is exposed through the mask 15 to a predetermined exposure energy such as ultraviolet rays, excimer laser beam or synchrotron orbit radiation, by which the semiconductor element pattern formed in the mask 15 is transferred onto the wafer 16.

In this figure, the arrangement comprises a semiconductor laser 1 which is a light emitting element, an LD driver 2 for driving the semiconductor laser 1, a pick-up optical system 3 for photoelectrically detecting the alignment marks 15a and 16a. The optical system 3 is constituted by a semiconductor laser 1, a collimator lens 12 for collimating the laser beam emitted from the semiconductor laser 1, a half mirror 13 for reflecting the beam from the collimator lens 12 toward the alignment marks 15a and 16a to illuminate it (illuminating beam is designated by a reference 14) and for transmitting a mark position information carrying beam 17 which has been diffracted by the alignment marks 15a and 16a, and a accumulation type line sensor 4 such as CCD for photoelectrically converting the information beam 17 having passed through the half mirror 13 into an electrical signal. The alignment marks 15a and 16a each have a Fresnel zone plate pattern which are effective to change the position at which the information beam 17 is incident on the light receiving surface of the line sensor 4 in accordance with the relative positional relationship therebetween in an X-Y plane. An example of the pick-up optical system is disclosed in U.S. Ser. No. 264,084 corresponding to a European Patent Application No. 89301471.2. A line sensor driver 5 serves to produce an accumulating time or the like for the line sensor 4, and to drive the line sensor 4 in accordance therewith. A signal processor 6 processes an output of the line sensor 4 (picture element signals from the respective receiving elements constituting the line sensor), and for determines the position of the center of gravity of the light strength distribution on the light receiving surface of the line sensor 4 by the information beam 17, for example. A timing controller 7 is effective to synchronize the LD driver 2 with the line sensor driver 5 and to control the energization and deenergization of the semiconductor laser 1. A timing setter 8 functions to set the operation control timing of the timing controller 7. The signal processor 6 determines the position of the center of gravity in the light strength distribution of the information beam incident on the light receiving surface of the line sensor 4 which is constituted by a number of photoreceiving elements arranged in the direction Y, and thereafter, it determines the relative deviation between the mask 15 and the wafer 16 in the plane X-Y on the basis of the gravity center data. By the alignment marks 15a and 16a, the positional deviation in the direction Y between the mask 15 and the wafer 16 can be obtained. The detailed procedure therefor are given in the above mentioned prior applications. In FIG. 1, the reference character S designates an example of the strength distribution of the information light 17 on the light receiving surface of the line sensor 4.

Referring to FIG. 2, the position detecting apparatus includes four pick-up optical systems 3 (3U, 3D, 3L and 3R) at regular intervals around the mask 15 the pick-up optical systems 3L and 3R being arranged along the X axis, and the pick-up optical systems 3U and 3D are arranged along Y-axis.

Figure 3:
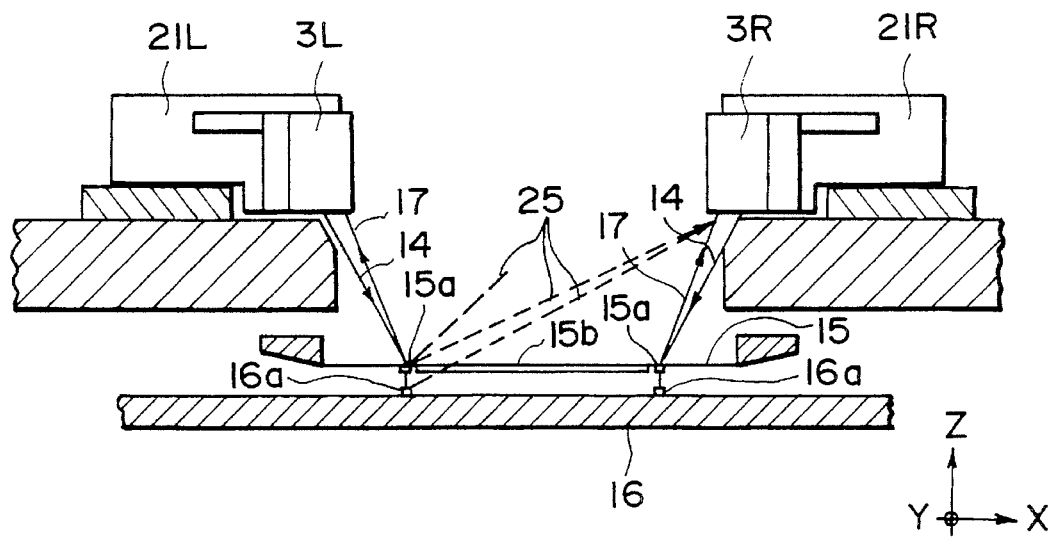
FIG. 3 is a sectional view of the arrangement shown in FIG. 2.

Referring to FIG. 3, each of the pick-up optical systems photoelectrically detect the alignment marks 15a and 16a which correspond to the pick-up optical systems. On the basis of the photoelectric detection from the alignment marks 15a and 16a, the pick-up optical system 3L and 3R determines the positional deviation of the mask 15 and the wafer 16 in the direction Y, whereas the pick-up optical systems 3U and 3D determine the relative positional deviation between the mask 15 and the wafer 16 in the direction X by the photoelectric detection, and thereby of the alignment marks 15a and 16a.

The four alignment marks 15a of the mask 15 are disposed at regular intervals along the circumference of the semiconductor element manufacturing pattern 15b formed in the mask 15. More particularly, they are respectively disposed outside the square pattern region 15b along the respective sides thereof. The pick-up optical system 3L, 3R, 3U and 3D are independently movable along X-Y plane. To accomplish this, they are respectively supported on X-Y stages 21L, 21R, 21U and 21D. The systems are the same as those described in conjunction with FIG. 1 in the other respects, and therefore, the detailed description thereof is omitted.

Figure 6:
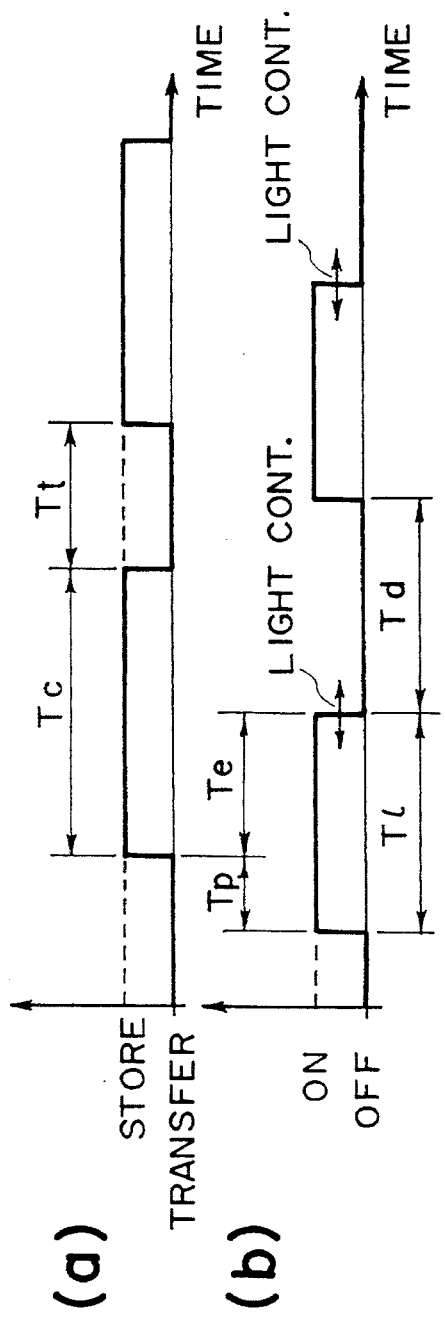
FIGS. 6(a) and 6(b) are a time chart illustrating the operational timing of the apparatus of this embodiment.

FIG. 6 shows the operational timing of the apparatus. The operation of the pick-up optical systems 3L, 3R, 3U and 3D are timed by the timing controller 7. More particularly, the on-duration time Tl of actuation of the semiconductor laser 1, the off time Td indicating the time when the semiconductor laser 1 is deactivated, the accumulation period Tc of the line sensor 4 and the transfer time Tt of the line sensor 4, are common to the pick-up optical systems 3L, 3R, 3U and 3D, that is, they are simultaneously operated. The timing controller 7 controls the timing so that Tc+Tt=Tl+Td is satisfied in each of the pick-up optical systems 3L, 3R, 3U and 3D. The accumulation period Tc and the transfer period Tt are controlled to be constant, respectively. The light emitting strength of the semiconductor laser 1 is controlled by the LD driver 2 so as to be constant during the effective emitting duration Te. The positional error between the mask 15 and the wafer 16 is determined on the basis of the mark detection signal S each of the line sensors 4 in which the information is accumulated by one accumulation period Tc.

As will be understood from FIG. 6, the on-duration Tl partly overlaps with the accumulation period Tc and the transfer period Tt of the line sensor. In the on-duration Tl, the portion overlapping with the transfer period Tt is a pre-emitting period Tp, and the portion overlapping the accumulation period Tc is an effective emitting duration or period Te. The preemitting period Tp is determined on the basis of the structure of the semiconductor laser 1.

FIG. 4 shows the structure of the semiconductor laser 1. In this semiconductor laser 1, the temperature change of the laser chip 31 is dependent on the thermal resistance, the thermal conductivity and heat capacity of a system 32 comprising a laser chip 31 and a heat sink (not shown) thermally coupled thereto. The pre-exposure period Tp is so determined that it is longer than the time period Ts (FIG. 5) required for the temperature of the laser chip 31 to be stabilized from the start of energization thereof.

FIG. 5 is a graph showing the temperature change of the laser chip 31 after actuation of the semiconductor laser 1.

The temperature of the laser chip 31 changes in the manner indicated by FIG. 5(b) depending on the thermal resistance, the thermal conductivity and the sheet capacity. More particularly, when the semiconductor laser is turned on, the temperature of the laser chip 31 increases from the ambient temperature ta and is finally saturated to a temperature ta' due to the heat transfer to the system 32. This change is dependent on the system 32 of the semiconductor laser 1 and the material and structure of the cap 34. In the structure of the currently available semiconductor laser, the time Ts required for the temperature saturates to within the range of + and −10%+the temperature ta' is 0.1–5 msec. After this time, the temperature of the laser chip 31 is stable. In view of this, the minimum of the pre-emitting period Tp is determined in consideration of the structure of the semiconductor laser 1, so as to satisfy:

$$Ts<Tp$$

The effective emitting period Te is variable in accordance with the users desire provided that $$0<Te<Tc$$

is satisfied. Therefore, the practical quantity of light can be provided depending on the individual line sensors 4.

In this embodiment, the effective emitting period Te is controlled by the timing controller 7, by which the effective quantity of light incident on the line sensor 4 is properly controlled.

For example, the accumulation time Tc is divided into 100 equal segments and the timing controller 7 controls the effective emitting period Te, the effective quantity of light of the rays incident on the line sensor 4 is controlled with $1/100$ step, by which the effective quantity of light can be properly controlled.

Figure 7:
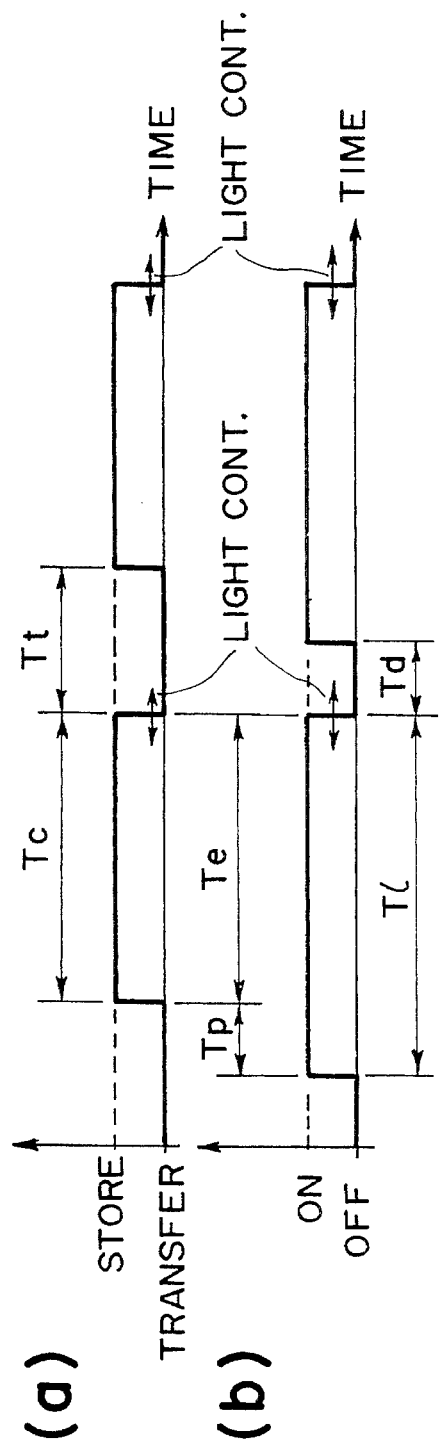
FIGS. 7(a) and 7(b) are a time chart illustrating the operational timing in an apparatus according to another embodiment of the present invention.

Referring to FIG. 7, a further embodiment will be described. This embodiment is similar to the foregoing embodiment, but the operational timing is different. As shown in FIG. 7, the effective emitting period Te and the accumulation period Tc begin at the same time and end at the same time. That is, $$Tc+Tt=Tl+Td, Te=Tc$$

The quantity is controlled in accordance with the above conditions.

The fundamental aspect of the light quantity control is similar to that of the foregoing embodiment, even after the semiconductor laser 1 stops its emitting operation, the line sensor 4 receives the incident stray light and accumulate the photo-electric converted signals during the accumulation period Tc. However, in the present embodiment, this is avoided. Accordingly, the advantage of a better S/N ratio signal obtainable from the line sensor 4, is provided, in addition to the advantage of the foregoing embodiment that the effective light quantity incident on the line sensor 4 can be properly controlled.

Referring to FIG. 8, a third embodiment of the present invention will be described. The structure of the apparatus is similar to those described in the foregoing. However, the operational timing is different as shown in FIG. 8. In the foregoing embodiments, the semiconductor lasers I for the pick-up systems 3L, 3R, 3U and 3D are simultaneously turned on and turned off. In doing so, a problem can arise, as shown in FIG. 3. For example, the illumination beams 14 from the pick-up systems 3L and 3R are parallel with the X-Z plane and are inclined relative to the Z-axis as shown in FIG. 3, and is projected onto the alignment marks. When the illumination beam 14 from the pick-up system 3L is diffracted by the marks 15a and 16a to become information beam 17, a part of the beam can be so scattered and diffracted as to be directed to the pick-up system 3R (light designated by reference 25). If this occurs, the line sensor 4 of the pick-up system 3R receives in addition to the information beam 17 the scattered light 25, with the result of a change in the distribution of the light intensity on the light receiving surface of the line sensor 4.

This embodiment pays attention to this problem, and the semiconductor laser 1 of the pick-up systems 3L, 3R, 3U and 3D are actuated in a time-shared manner. In this case, each of the pick-up systems 3L, 3R, 3U and 3D may be operate at different times. Alternatively, the semiconductor lasers 1 of the pick-up systems 3L and 3U may be operated at the same timing, and the semiconductor lasers I of the pick-up systems 3R and 3D are operated at the same timing as each other, but at the different timing from the pick-up systems 3L and 3U. FIG. 8 illustrates the latter case.

In this figure, reference (a) designates the accumulation and transfer timing of the line sensor 4 of the pick-up systems 3L, 3R, 3U and 3D; (b) designates the turn-on and turn-off timing of the semiconductor lasers 1 for the pick-up systems 3L and 3U; and (c) designates turn-on and turn-off timing of the semiconductor lasers 1 of the pick-up systems 3R and 3D. In this embodiment, the signal processor 6 for the pick-up systems 3L and 3U determines the deviation between the mask 15 and the wafer 16 on the basis of the mark detection signal accumulated in the line sensor 4 during the period A of the accumulation period Tc, and signal processor 6 for the pick-up systems 3R and 3D determines the deviation between the mask 15 and the wafer 16 on the basis of the mark detection signal accumulated in the line sensor 4 during the period B. This embodiment is the same as that described with FIG. 6 in the other respects.

In the foregoing embodiments, the photoelectric transducer element is a CCD line sensor, but another type line sensor such as CCD area sensor or the like in usable.

As described in the foregoing, according to the present invention, the quantity of the light received by the photoelectric transducer element is not continuous (analog), but the light emitting period of the emitting element having a constant output is controlled to be optimal. Therefore, the quantity of light incident on the photoelectric transducer element can be controlled without variation of the oscillation mode, the oscillation wavelength, the coherency length, the light emitting position, the configuration of light emitting spot or the like.

During the transient condition in which the temperature of the light emitting element is changing after it is actuated, the control is effected such that the sensor does not accumulate the photo-electric converted signal, and therefore, the optical measurement such as the position measurement can be performed without influence of the variation of the oscillation mode, the oscillation wavelength, the coherency length, the light emitting point, or the configuration of the light emitting point.

Accordingly, the present invention makes it possible to control the quantity of light without being influenced by the variation in the oscillation mode, the oscillation wavelength, coherency length, the light emitting position, the configuration of the light emitting spot or the like of the light source. Therefore, the transmissivity, the reflection index, the refraction index, the diffraction index of the optical system does not change from the designed values, and therefore, the optical measurement can be performed with high precision.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for detecting a position of a substrate using plural marks formed on the substrate, comprising:

first and second mark detecting means spaced from each other in a first direction and disposed adjacent respective sides of the substrate and spaced from a surface of the substrate in a second direction;

said first mark detecting means including a light emitting element for illuminating one of the marks with a beam along a plane including the first and second directions and a photoelectric detecting element for photoelectrically detecting said one of the marks illuminated by said light emitting element, said light emitting element being turned on earlier than the start of the photoelectric detection by said photoelectric detecting element;

said second mark detecting means including a light emitting element, for illuminating another one of the marks with a beam along said plane, and a photoelectric detecting element for photoelectrically detecting said another mark illuminated by said light emitting element of said second mark detecting means, said light emitting element of said second mark detecting means being turned on earlier than the start of photoelectric detection by said photoelectric detecting element of said second mark detecting means;

control means for controlling said light emitting elements of said first and second mark detecting means so that when either one of said light emitting elements of said first and second mark detecting means is turned on, another one of said light emitting elements of said first and second mark detecting means is not turned on.

2. An apparatus according to claim 1, wherein said light emitting element includes a semiconductor laser.

3. An apparatus according to claim 1, wherein the actuation of said semiconductor laser is in advance by at least time required for thermal stabilization of said semiconductor laser.

4. An apparatus according to claim 1, wherein the substrate is a wafer, to which a pattern is projected and transferred.

5. An apparatus according to claim 1, wherein the substrate comprises a mask having a pattern.

6. An apparatus according to claim 1, wherein the marks comprise diffraction grating marks.

7. An apparatus according to claim 1, wherein said photoelectric detecting element is of an accumulation type.

8. An apparatus for detecting a position of a substrate using plural marks formed on the substrate, comprising:

first and second mark detecting means spaced from each other in a first direction and disposed adjacent respective sides of the substrate and spaced from a surface of the substrate in a second direction;

said first mark detecting means including a light emitting element for illuminating one of the marks with a beam along a plane including the first and second directions and a photoelectric detecting element for photoelectrically detecting said one of the marks illuminated by said light emitting element;

said second mark detecting means including a light emitting element, for illuminating another one of the marks with a beam along said plane, and a photoelectric detecting element for photoelectrically detecting said another mark illuminated by said light emitting element of said second mark detecting means; and control means for controlling said light emitting elements of said first and second mark detecting means so that when either one of said light emitting elements of said first and second mark detecting means is turned on, another one of said light emitting elements of said first and second mark detecting means is not turned on.

9. An apparatus according to claim 8, wherein the substrate is a wafer, to which a pattern is projected and transferred.

10. An apparatus according to claim 9, wherein the substrate comprises a mask having a pattern.

11. An apparatus according to claim 8, wherein the marks comprise diffraction grating marks.

12. An apparatus according to claim 8, wherein said light emitting element includes a semiconductor laser.

13. An apparatus according to claim 8, wherein said photoelectric detecting element is of an accumulation type.

14. An apparatus for detecting positional information of a substrate using plural marks formed on the substrate, comprising:

first and second detecting means disposed with the substrate therebetween as seen perpendicularly to a surface of the substrate, said first detecting means including a light emitting element for illuminating one of the marks with a beam, and a photoelectric detecting element for photoelectrically detecting said one of the marks illuminated by said light emitting element, said second detecting means including a light emitting element for illuminating another one of the marks with a beam, and a photoelectric detecting element for photoelectrically detecting said another mark illuminated by said light emitting element of said second detecting means; and control means for controlling said light emitting elements of said first and second detecting means so that when either one of said light emitting elements of said first and second detecting means is turned on, another one of said light emitting elements of said first and second detecting means is not turned on.

15. An apparatus according to claim 14, wherein the substrate comprises a wafer, to which a pattern is transferred.

16. An apparatus according to claim 14, wherein the substrate comprises a mask having a pattern.

17. An apparatus according to claim 14, wherein the marks comprise diffraction grating marks.

18. An apparatus according to claim 14, wherein at least one of said light emitting elements includes a semiconductor laser.

19. An apparatus according to claim 14, wherein at least one of said photoelectric detecting elements is of an accumulation type.

20. An apparatus for detecting positional information of a substrate using plural marks formed on the substrate, comprising:

first and second detecting means disposed around the substrate as seen from a line perpendicular to a surface of the substrate, said first detecting means including a light emitting element for illuminating one of the marks with a beam, and a photoelectric detecting element for photoelectrically detecting said one of the marks illuminated by said light emitting element, said second detecting means including a light emitting element for illuminating another one of the marks with a beam, and a photoelectric detecting element for photoelectrically detecting said another mark illuminated by said light emitting element of said second detecting means; and control means for controlling said light emitting elements of said first and second mark detecting means so that when either one of said light emitting elements of said first and second mark detecting means is turned on at no less than a predetermined emission level to detect the mark, another one of said light emitting elements of said first and second mark detecting means is not turned on at no less than the predetermined emission level.

21. An apparatus according to claim 20, wherein the substrate comprises a wafer, to which a pattern is transferred.

22. An apparatus according to claim 20, wherein the substrate comprises a mask having a pattern.

23. An apparatus according to claim 20, wherein the marks comprise diffraction grating marks.

24. An apparatus according to claim 20, wherein at least one of said light emitting elements includes a semiconductor laser.

25. An apparatus according to claim 20, wherein at least one of said photoelectric detecting elements is of an accumulation type.

* * * * *

UNITED STATES PATENT AND TRADEMARK OFFICE
CERTIFICATE OF CORRECTION

PATENT NO. : 5,459,573
DATED : October 17, 1995
INVENTOR(S) : NAOTO ABE, et al.

It is certified that error appears in the above-indentified patent and that said Letters Patent is hereby corrected as shown below:

ON THE COVER PAGE

[56] References Cited

OTHER PUBLICATIONS

"Verlag, et al." should read --FRANZIS-VERLAG--.

[57] ABSTRACT

Line 1, "mask" should read --a mask--.
Line 5, "are" should read --is--.
Line 8, "are" should read --is--.
Line 12, "thee" should read --the--.

COLUMN 1

Line 58, "degrated" should read --degraded--.
Line 62, "degrated" should read --degraded--.

COLUMN 2

Line 2, "photoelectric" should read --the photoelectric--.
Line 12, "a" should read --the--.
Line 13, "the" (third occurrence) should read --a--.
Line 22, "to" should be deleted.
Line 25, "the" should be deleted.

UNITED STATES PATENT AND TRADEMARK OFFICE
CERTIFICATE OF CORRECTION

PATENT NO. : 5,459,573
DATED : October 17, 1995
INVENTOR(S) : NAOTO ABE, et al.

It is certified that error appears in the above-indentified patent and that said Letters Patent is hereby corrected as shown below:

COLUMN 3

Line 28, "a" should read --an--.
    Line 44, "for" should be deleted.

COLUMN 4

Line 2, "mask 15" should read --mask 15,--.
    Line 4, "are" should read --being--.
    Line 5, "Y-axis" should read --the Y-axis--.
    Line 22, "system 3L," should read --systems 3L,--.
    Line 23, "X-Y plane," should read --the X-Y plane.--.
    Line 46, "S" should read --from--.
    Line 54, "preemitting" should read --pre-emitting--.

COLUMN 5

Line 19, "users" should read --user's--.
    Line 49, "accumulate" should read --accmumulates--.
    Line 50, "photo-electric" should read --photoelectric--.
    Line 67, "is" should read --are--.

UNITED STATES PATENT AND TRADEMARK OFFICE
CERTIFICATE OF CORRECTION

PATENT NO. : 5,459,573

DATED : October 17, 1995

INVENTOR(S) : NAOTO ABE, et al.

It is certified that error appears in the above-indentified patent and that said Letters Patent is hereby corrected as shown below:

COLUMN 6

Line 13, "operate" should read --operated--.
    Line 38, "in" should read --is--.
    Line 52, "photo-electric" should read --photoelectric--.
    Line 54, "influence of" should read --influences on--.
    Line 60, "coherency" should read --the coherency--.

COLUMN 7

Line 28, "means;" should read --means; and--.
    Line 39, "time" should read --the time--.

COLUMN 8

Line 11, "claim 9," should read --claim 8,--.

Signed and Sealed this

Second Day of April, 1996

Attest:

BRUCE LEHMAN

*Attesting Officer*    *Commissioner of Patents and Trademarks*